US006952119B2

(12) United States Patent
Anderson

(10) Patent No.: US 6,952,119 B2

(45) Date of Patent: Oct. 4, 2005

(54) AUXILIARY OUTPUT DRIVER

(75) Inventor: Douglas Anderson, Nevada, IA (US)

(73) Assignee: Micrel, Incorporated, San Jose, CA (US)

(*) Notice: Subject to any disclaimer, the term of this patent is extended or adjusted under 35 U.S.C. 154(b) by 0 days.

(21) Appl. No.: 10/766,399

(22) Filed: Jan. 28, 2004

(65) Prior Publication Data

US 2005/0162196 A1 Jul. 28, 2005

(51) Int. Cl.[7] .................... H03K 5/22

(52) U.S. Cl. .................... 327/77; 327/142; 327/143

(58) Field of Search .................... 327/77, 433, 78, 327/143, 142

(56) References Cited

U.S. PATENT DOCUMENTS

| | | | | |
|---|---|---|---|---|
| 4,716,309 | A * | 12/1987 | Stroppiana | 327/526 |
| 5,057,709 | A * | 10/1991 | Petty et al. | 327/77 |
| 5,136,181 | A * | 8/1992 | Yukawa | 327/143 |
| 5,352,932 | A * | 10/1994 | Tihanyi | 327/109 |
| 5,565,807 | A * | 10/1996 | Ward | 327/205 |
| 5,811,962 | A * | 9/1998 | Ceccherelli et al. | 323/282 |
| 6,246,243 | B1 * | 6/2001 | Audy | 324/550 |
| 6,268,764 | B1 * | 7/2001 | Eagar et al. | 327/539 |
| 6,768,352 | B1 * | 7/2004 | Maher et al. | 327/112 |

* cited by examiner

*Primary Examiner*—Tuan T. Lam
*Assistant Examiner*—Hiep Nguyen
(74) *Attorney, Agent, or Firm*—J. V. Tortolano; E. H. Valet

(57) ABSTRACT

A BiCMOS auxiliary output driver is provided to maintain output logic signal levels when integrated circuit chip power supply voltage is outside its nominal range. When the power supply voltage level is within design tolerance for a MOSFET output driver stage, the auxiliary output driver is off; when below design tolerance, the auxiliary output driver is turned on. Driver stage output pad signal level is maintained at a desired state level by the auxiliary output driver whenever the power supply slips below its design tolerance range.

15 Claims, 2 Drawing Sheets

AUXILIARY OUTPUT DRIVER

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO AN APPENDIX

Not applicable.

BACKGROUND

1. Technical Field

The technology described herein is generally related to the field of integrated circuits ("IC"); IC structures and devices are also referred to hereinafter as "chip(s)," and "dice" or "die."

2. Description of Related Art

The integrated circuit field of technology is well established. Many publications describe the details of commonly known techniques used in the fabrication of integrated circuits that can be generally employed in the fabrication of complex, three-dimensional, IC structures and devices; see e.g., *Silicon Processes*, Vol. 1–3, copyright 1995, Lattice Press, Lattice Semiconductor Corporation, Hillsboro, Oreg. Moreover, the individual steps of such a process can be performed using commercially available IC fabrication machines. The use of such machines and commonly used fabrication step techniques will be referred to hereinafter as simply: "in a known manner." As specifically helpful to an understanding of the present invention, approximate technical data are disclosed herein based upon current technology; future developments in this art may call for appropriate adjustments as would be apparent to one skilled in the art.

Certain commercial products employing IC chips require the state of a digital output signal stays at a predetermined logic signal, "HIGH" or "LOW," even when supply voltages are below the threshold voltage of the output stage driver field effect transistors ("FETs"). For example, a voltage monitoring instrument needs to transmit accurately the true output of the circuitry being monitored. Other examples of such products are power-on reset generators, microprocessor supervisors, and chip-select drivers.

Known manner complementary metal-oxide-semiconductor ("CMOS") circuit designs may not result in a "guaranteed" output state when the supply voltage falls below a threshold voltage of the output stage driver FETs. On the other hand, lowering the threshold voltage may improve performance of an IC, but generally requires a change to the wafer-level IC dice fabrication processes. However, lowering the threshold voltage may have undesired electrical effects such as increasing leakage currents. Therefore, there are competing interests for the IC designer to consider.

There is a need for improved electronic circuits for commercial products where output stage signals are a critical factor of performance.

BRIEF SUMMARY

The present invention generally provides for an integrated circuit output driver stage for ensuring a predetermined output when power supply voltage falls below an expected level.

The foregoing summary is not intended to be inclusive of all aspects, objects, advantages and features of the present invention nor should any limitation on the scope of the invention be implied therefrom. This Brief Summary is provided in accordance with the mandate of 37 C.F.R. 1.73 and M.P.E.P. 608.01(d) merely to apprise the public, and more especially those interested in the particular art to which the invention relates, of the nature of the invention in order to be of assistance in aiding ready understanding of the patent in future searches.

Like reference designations represent like features throughout the drawings. The drawings in this specification should be understood as not being drawn to scale unless specifically annotated as such.

DETAILED DESCRIPTION

Figure 1:
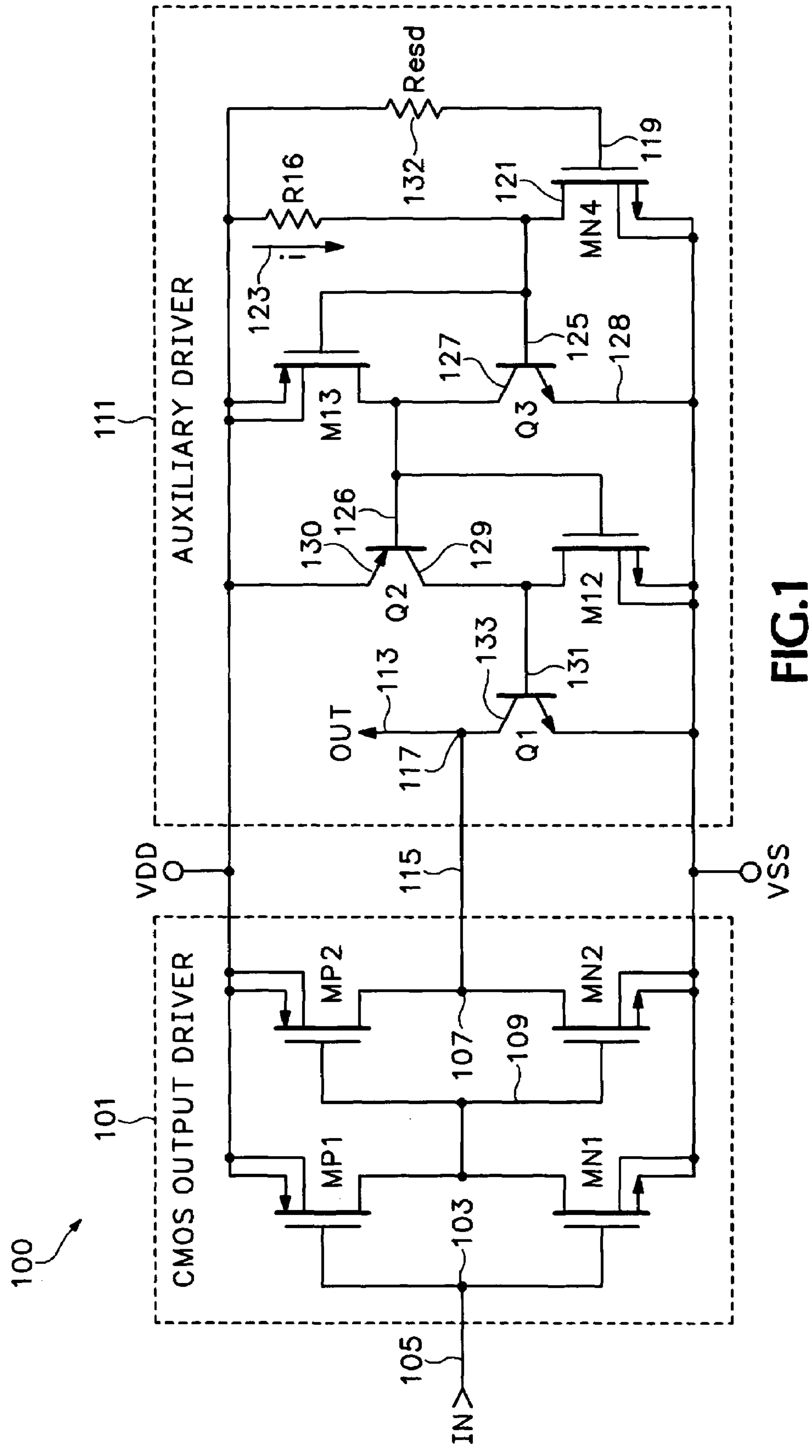
FIG. 1 is an electrical schematic diagram in accordance with an exemplary embodiment of the present invention.

FIG. 1 is an electrical schematic diagram for a circuit 100 in accordance with a first exemplary embodiment of the present invention. Standard electrical engineering symbols and conventions are shown in this layout such that a person skilled in the art will recognize the components and their respective interconnections. While the exemplary embodiments described herein is illustrative of using semiconductor devices having a specific transistor polarity implementation, it will be recognized by those skilled in the art that an implementation of reverse polarity devices can be made. No limitation on the scope of the invention is intended by the exemplary embodiments and none should be implied therefrom. An experimental implementation was constructed in a BiCMOS technology process; device sizes and the like may be adjusted as would be evident to persons skilled in the art for scaling the components and adapting the present invention to a specific implementation.

A CMOS Output Driver 101 is a typical known manner, output driver having four metal oxide semiconductor field effect transistors ("MOSFET") MP1, MP2, MN1, MN2 and forming an output driver stage on-board a chip, not shown. The Driver 101 is designed for receiving digital logic signals—represented by "In" symbol 105—at an input node 103 from on-board chip circuitry, not shown, and providing an amplified output signal at the output driver stage output node 107. A power supply voltage, Vss, for example, a known manner DC volt source, not shown, provide a nominal design voltage, or can be an electrical ground. A drain-source bias voltage, $V_{DD}$, for the MOSFETs MP1, MP2, MN1, MN2 of this embodiment is, for example, a known manner 3.3 volt ±0.3 DC source, not shown.

Generally, when the voltage $V_{DD}$ is at its design nominal value, it is well above the threshold voltage for the MOSFETs MP1, MP2, MN1, MN2, the voltage at the output driver stage output node 107 will be LOW when the signal In 105 is LOW and HIGH when the signal In 105 is HIGH.

However, when the signal In 105 is LOW and the voltage $V_{DD}$ approaches or falls below the threshold voltage, the state of the output driver stage at output node 107 can float up from the LOW state since there is not enough voltage on the gate line 109 of MOSFET MN2 to keep MOSFET MN2 in the ON state.

In accordance with the exemplary embodiment of the present invention in a bipolar-CMOS ("BiCMOS") implementation, an Auxiliary Driver 111 is added to the chip output stage. The function of the Auxiliary Driver 111 is to supplement output signal driving at low $V_{DD}$ voltages and to ensure that output at the output pad 113 of the chip remains LOW. The output pad 113 of the chip is connected to CMOS Output Driver 101 output node 107 via line 115 and Auxiliary Driver output node 117.

When the voltage $V_{DD}$ is at or above its design nominal value, the gate 119 of Auxiliary Driver MOSFET MN4 is pulled up; that is, it may be considered at a logic HIGH level. This removes the base drive signal from npn-type bipolar transistor Q3. Removing the base drive signal from bipolar transistor Q3 removes the base drive signal from pnp-type bipolar transistor Q2. Therefore, for $V_{DD}$=HIGH, the Auxiliary Driver 111 is OFF and so it does not influence the state of the output signal at output pad 113.

When the voltage $V_{DD}$ drops below the threshold voltage for Auxiliary Driver MOSFET MN4, the drain 121 is pulled up by the voltage drop across bias resistor R16, sized appropriately to the specific implementation. The current, "I," through resistor R16, represented by arrow 123, is forced on a circuit path to the base 125 of npn-type bipolar transistor Q3. The collector 127 of bipolar transistor Q3 draws current out of the base 126 of the transistor Q2. The collector 129 of transistor Q2 pushes current into the base 131 of npn-type bipolar transistor Q1. The collector 133 of transistor Q1 now draws node 117 LOW. Thus, the output pad 113 LOW condition is maintained appropriately. In other words, by turning on the Auxiliary Driver 111 whenever the voltage $V_{DD}$ falls below the design threshold voltage for driving the CMOS Output driver 101, a LOW output signal is guaranteed at the associated output pad 113.

Note that another advantage of the circuit 100 of the present invention is that the output pad 113 LOW condition remains at the LOW digital signal value even if there is significant external impedance from the device output to the positive supply, such as via a pull-up resistor, not shown.

In the preferred embodiment, the threshold voltage of Auxiliary Driver MOSFET MN4 should be substantially equivalent to the threshold voltage of CMOS Output Driver MOSFET MN2. In this manner, the Auxiliary Driver 111 begins to operate at the supply voltage when it is most needed.

In the preferred embodiment, another MOSFET transistor M13 is connected in Auxiliary Driver 111 so that leakage current from the collector 127 to the emitter 128 will not erroneously turn transistors Q1 and Q2 ON.

Similarly, in the preferred embodiment, another MOSFET transistor M12 is connected in Auxiliary Driver 111 so that leakage current in transistor Q2 from the collector 129 to the emitter 130 will not erroneously turn transistor Q1 ON.

In the preferred embodiment a resistor, "Resd," 133, is provided to protect the gate of Auxiliary Driver MOSFET MN4 from electrostatic discharge into the supply voltage $V_{DD}$ or $V_{SS}$.

Thus, it can be recognized that the circuit 100 is capable of providing a substantial amount of sink current so that the output voltage will be a logic LOW even when the voltage $V_{DD}$ falls lower that specified. Any pull-up resistance voltage drop that this circuit 100 may have to drive will also be established at logic LOW. The maximum amount of drive is determined by the gains of the bipolar transistors and the value of the bias resistor R16.

Figure 2:
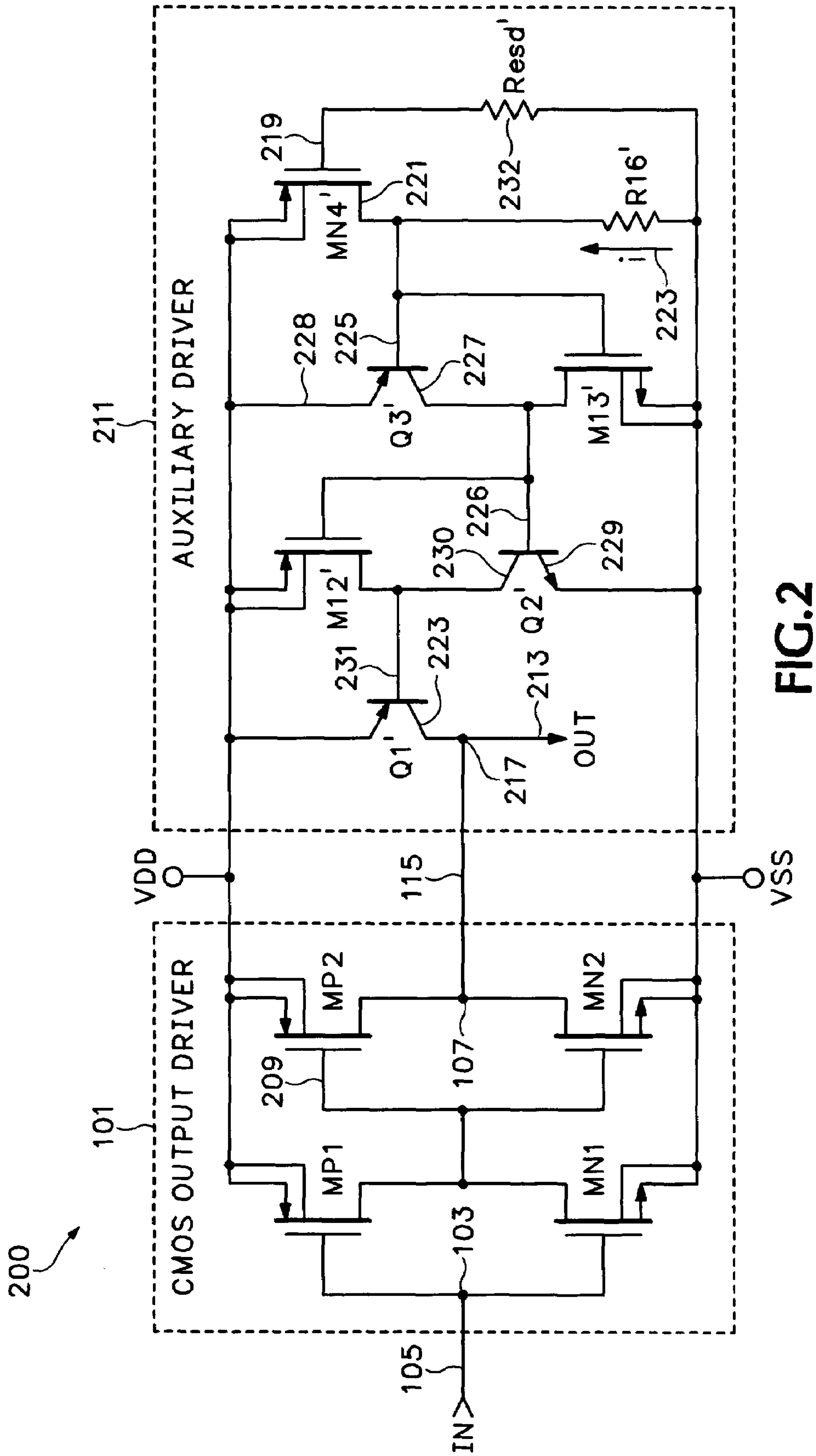
FIG. 2 is an electrical schematic diagram in accordance with another exemplary embodiment of the present invention.

FIG. 2 is an electrical schematic diagram in accordance with another exemplary embodiment. It will be recognized by those skilled in the art that this is a complementary version of the circuit 100 shown in FIG. 1, built to guarantee that an output 213 stays HIGH at node 217 at low power supply voltage levels.

As with FIG. 1, a CMOS Output Driver 101 is a typical known manner, output driver having four metal oxide semiconductor field effect transistors ("MOSFET") MP1, MP2, MN1, MN2 and forming an output driver stage on-board a chip, not shown. It may similarly be advantageous to ensure a logic signal HIGH on the Output Driver output signal line 115. Again, however, when the In signal 105 is HIGH and the voltage $V_{DD}$ approaches or falls below output driver MOSFET MP1, MP2, MN1, MN2 threshold voltage, the state of the output of the CMOS Output Driver 101 can float down on its output line 115 as there will then not be enough voltage on the gate 209 of driving MOSFET MP2 to maintain an ON condition. The Auxiliary Driver 211 is added to supplement the CMOS Output Driver 101 when the voltage $V_{DD}$ falls below the threshold voltage level needed for the output driver stage MOSFETs MP1, MP2, MN1, MN2.

When the voltage $V_{DD}$ is at its design nominal level, the gate 219 of auxiliary driver MOSFET MP4 is pulled down, viz., to a logic LOW level. This removes base drive signal from a pnp-type bipolar transistor Q3'. Consequently, the base drive signal is removed from a npn-type bipolar transistor Q2' which in turn remove the base drive signal from a pnp-type bipolar transistor Q1'. Thus, for voltage $V_{DD}$ at its nominal level, the Auxiliary Driver remains in an OFF condition.

When the voltage $V_{DD}$ drops below its design nominal level and, therefore is not sufficient for operation of the CMOS Output Drive 101, the drain 221 of transistor MP4 is pulled down by bias resistor R16'. The current, represented by arrow 223 labeled "I," through R16' can come from nowhere else but the base 225 of bipolar transistor Q3'. The collector 227 of transistor Q3' then pushes current into the base 226 of transistor Q2'. In turn, the collector 229 of transistor Q2' pulls current out of the base 231 of transistor Q1'. The collector 233 of transistor Q1' is pulled to a logic level HIGH; this occurs even if there is significant external impedance, such as a pull-down resistor, not shown, from the output pad 213 to ground.

As with the embodiment of FIG. 1, the threshold voltage for Auxiliary Driver 211 transistor MP4 should be substantially the same as the threshold voltage for CMOS Output Driver 201 transistor MP2 in order for the Auxiliary Driver 211 to begin to operate only when the supply voltage $V_{DD}$ is out of its nominal design value.

In a preferred embodiment, electrostatic discharge protection resistor, "Resd," 232 is provided to protect the gate 219 of transistor MP4.

In a preferred embodiment, an auxiliary driver MOSFET transistor M13' is connected so that leakage current from the emitter 228 to collector 227 of transistor Q3' will not errantly turn transistor Q2' and Q1' ON.

In a preferred embodiment, an auxiliary driver MOSFET transistor M12' is connected so that leakage current from collector 230 to emitter 229 in Q2' will not erroneously turn transistor Q1' ON.

Thus, it can be recognized that the circuit 200 is capable of providing a substantial amount of source current so that the output voltage will be a logic HIGH even when the supply voltage $V_{DD}$ falls lower that specified. Any pull-down resistance voltage drop that this circuit 200 may have to drive will also be established at logic HIGH. The maximum amount of drive is determined by the gains of the bipolar transistors and the value of the bias resistor R16'.

It is important to note for both described exemplary embodiments that once the supply voltage drops to the level where the Auxiliary Driver 111 or 211 becomes activated, the output state 113, 213, respectively, will be at the desired state—namely, LOW in FIG. 1 or HIGH in FIG. 2—independent of the input state. In many cases, once the supply voltage gets too low, whatever is driving the input 105 may no longer be a known, defined state.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. Connected to an output pad of an integrated circuit, an output driver circuit device, having a predetermined power supply voltage nominal level, the device comprising:

a MOSFET first stage including a means for amplifying an input signal and a means for outputting an output signal state; and a BiCMOSFET second stage including means for automatically maintaining said output signal at the output signal state when said power supply voltage nominal level is less than a threshold voltage required for said MOSFET first stage to maintain said output signal state.

2. The device as set forth in claim 1 wherein said second stage includes BiCMOSFET components for maintaining said output signal state at a digital logic LOW.

3. The device as set forth in claim 2, comprising:

said second stage providing a substantial amount of sink current such that said output signal is said digital logic LOW even when the power supply voltage falls lower than said nominal level.

4. The device as set forth in claim 1 wherein said second stage includes BiCMOSFET components for maintaining said output signal state at a digital HIGH.

5. The device as set forth in claim 4, comprising:

said second stage providing a substantial amount of source current such that said output signal is said digital logic HIGH even when the power supply voltage falls lower than said nominal level.

6. The device as set forth in claim 1 wherein said second stage is a BiCMOSFET auxiliary output driver maintained in a desired state when said power supply voltage nominal level is substantially equal to but no less than said threshold voltage.

7. The device as set forth in claim 6 wherein threshold voltage of an output driving connected MOSFET of said BiCMOSFET auxiliary output driver is substantially equivalent to threshold voltage of an output driving MOSFET of said first stage.

8. The device as set forth in claim 6 further comprising:

means for preventing leakage current in bipolar components from turning said BiCMOSFET auxiliary output driver to an ON state when said power supply voltage nominal level is within design criteria operating range.

9. The device as set forth in claim 1 further comprising:

said second stage including means for protecting said second stage from electrostatic discharge into power supply nodes.

10. The device as set forth in claim 1 wherein maximum amount of drive to said output pad is determined by respective gains of bipolar transistors of said BiCMOSFET second stage and resistance value of a bias resistor therefor.

11. An auxiliary output signal driver device for a CMOS output driver circuit for an output pad of an integrated circuit, having a given power supply voltage having an operating range wherein said operating range maintains threshold voltage for MOSFET components of said output driver circuit, said auxiliary output signal driver device comprising:

coupled to said output pad, an output node from a series of bipolar transistors, said bipolar transistors having a predetermined bias resistor for determining current flow thereto; and connected to said bias resistor, a MOS transistor for shunting a current that passes through said bias resistor, such that when said power supply voltage is substantially within said operating range the MOS transistor prevents the current from driving a base of a first bipolar transistor of said series, and when said power supply is below said operating range the MOS transistor is not shunting the current that passes through said bias resistor and the current is thereby driving the base of the first bipolar transistor of said series.

12. The device as set forth in claim 11 wherein when said MOS transistor is driving the current, said device is providing a substantial amount of sink current such that said output signal is said digital logic LOW even when the power supply voltage falls below said operating range.

13. The device as set forth in claim 11 wherein when said MOS transistor is driving current, said device is providing a substantial amount of source current such that said output signal is said digital logic HIGH even when the power supply voltage falls below said operating range.

14. The device as set forth in claim 11 wherein threshold voltage of an output driving connected MOSFET of said BiCMOSFET auxiliary output driver is substantially equivalent to threshold voltage of an output driving MOSFET of said first stage.

15. A output driver circuit for an integrated circuit having a $V_{DD}$ power supply operating range, the circuit comprising:

MOSFET means for amplifying an input signal to said output driver circuit such that a digital signal state level is output therefrom; and coupled to said means for amplifying, BiCMOS means for maintaining the digital signal state level output by said circuit when $V_{DD}$ power supply voltage falls beneath said $V_{DD}$ power supply voltage operating range, wherein said BiCMOS means for maintaining is inactive when said $V_{DD}$ power supply voltage is within said $V_{DD}$ power supply voltage operating range.

* * * * *